US010326412B2

(12) United States Patent
Chen et al.

(10) Patent No.: US 10,326,412 B2
(45) Date of Patent: Jun. 18, 2019

(54) AMPLIFIER USED TO IMPROVE OPERATIONAL PERFORMANCE UNDER BYPASS MODE

(71) Applicant: RichWave Technology Corp., Taipei (TW)

(72) Inventors: Chih-Sheng Chen, Taipei (TW); Chang-Yi Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/008,054

(22) Filed: Jun. 14, 2018

(65) Prior Publication Data
US 2018/0294778 A1  Oct. 11, 2018

Related U.S. Application Data

(62) Division of application No. 15/469,566, filed on Mar. 26, 2017, now Pat. No. 10,027,289.

(30) Foreign Application Priority Data

Mar. 28, 2016 (TW) .............................. 105109629 A

(51) Int. Cl.
| | |
|---|---|
| *H03F 1/30* | (2006.01) |
| *H03F 1/56* | (2006.01) |
| *H03F 3/16* | (2006.01) |
| *H03F 1/02* | (2006.01) |
| *H03F 1/22* | (2006.01) |

(Continued)

(52) U.S. Cl.
CPC ............. *H03F 1/56* (2013.01); *H03F 1/0277* (2013.01); *H03F 1/223* (2013.01); *H03F 3/16* (2013.01); *H03F 3/193* (2013.01); *H03F 3/72* (2013.01); *H03F 2200/294* (2013.01); *H03F 2200/387* (2013.01); *H03F 2200/555* (2013.01); *H03F 2203/7239* (2013.01)

(58) Field of Classification Search
CPC ........................................................ H03F 1/30
USPC .................................. 330/296, 311, 285, 85
See application file for complete search history.

(56) References Cited

U.S. PATENT DOCUMENTS

| | | |
|---|---|---|
| 5,451,906 A | 9/1995 | Kaltenecker |
| 5,742,205 A | 4/1998 | Cowen |

(Continued)

OTHER PUBLICATIONS

B.Razavi, "Design of Analog CMOS Integrated Circuits", McGraw-Hill, 2001.pp. 139-145,301-305.

*Primary Examiner* — Henry Choe
(74) *Attorney, Agent, or Firm* — Winston Hsu

(57) ABSTRACT

An amplifier includes an input terminal for receiving an input signal, an output terminal for outputting an output signal, a first transistor, a second transistor having a first terminal coupled to a second terminal of the first transistor, a third transistor having a first terminal coupled to a second terminal of the second transistor, a capacitor coupled between a control terminal and a second terminal of the third transistor, a bias circuit coupled to the first terminal of the third transistor for providing a bias voltage to the third transistor, a fourth transistor having a first terminal coupled to the input terminal and a second terminal coupled to the output terminal for providing a bypass path, and a fifth transistor having a first terminal coupled to the first terminal of the first transistor and a second terminal coupled to the output terminal.

13 Claims, 10 Drawing Sheets

(51) Int. Cl.
*H03F 3/193* (2006.01)
*H03F 3/72* (2006.01)

(56) References Cited

U.S. PATENT DOCUMENTS

| | | | |
|---|---|---|---|
| 5,793,254 A | 8/1998 | O'Connor | |
| 6,177,837 B1 | 1/2001 | Aoki | |
| 6,768,374 B1 | 7/2004 | Lee | |
| 7,205,836 B2 | 4/2007 | Helms | |
| 7,551,036 B2 * | 6/2009 | Berroth | H03F 1/0277 330/310 |
| 8,063,706 B2 * | 11/2011 | Li | H03F 1/0244 330/290 |
| 8,120,428 B2 * | 2/2012 | Montalvo | H03F 1/223 330/293 |
| 8,754,712 B2 * | 6/2014 | Seebacher | H03F 1/0277 330/311 |
| 9,843,293 B1 * | 12/2017 | Wagh | H03F 1/0261 |
| 2003/0048138 A1 | 3/2003 | Van De Westerlo | |
| 2013/0229237 A1 | 9/2013 | Takenaka | |
| 2015/0091650 A1 | 4/2015 | Nobbe | |

* cited by examiner

AMPLIFIER USED TO IMPROVE OPERATIONAL PERFORMANCE UNDER BYPASS MODE

CROSS REFERENCE TO RELATED APPLICATION

This application is a division of U.S. application Ser. No. 15/469,566 filed Mar. 26, 2017, which is included herein by reference in its entirety.

TECHNICAL FIELD

The present invention relates to an amplifier, and more specifically, an amplifier used to improve operational performance under a bypass mode.

BACKGROUND

In wireless communications, when the intensity of an input signal is low, an amplifier (e.g. a low noise amplifier a.k.a. LNA) can be used to amplify the input signal. When the intensity of the input signal is high enough, the control circuit can be switched to a bypass mode to bypass the amplifier so as to reduce power consumption.

To perform the abovementioned operation, a bypass circuit may be coupled between an input terminal and an output terminal of the amplifier, and a switch can be installed at the output terminal of the amplifier. When the intensity of the input signal is high enough, the switch can be turned off so as to output the input signal via the bypass circuit. However, when the intensity of the input signal is high enough, unexpected conduction may happen on semiconductor junctions of transistors of the amplifier, and linearity of the bypass circuit may be affected.

SUMMARY

An embodiment of the present invention provides an amplifier including an input terminal, an output terminal, a first transistor, a second transistor, a third transistor, a first capacitor, a bias circuit, a fourth transistor and a fifth transistor. The input terminal may be used to receive an input signal. The output terminal may be used to transmit an output signal corresponding to the input signal. The first transistor may include a control terminal, a first terminal and a second terminal. The second transistor may include a first terminal coupled to the second terminal of the first transistor, a control terminal, and a second terminal. The third transistor may include a first terminal coupled to the second terminal of the second transistor, a control terminal, and a second terminal. The first capacitor may include a first terminal coupled to the control terminal of the third transistor, and a second terminal coupled to the second terminal of the third transistor. The bias circuit may include a first terminal coupled to the first terminal of the third transistor, and a second terminal used to provide a bias voltage to the first terminal of the third transistor. The fourth transistor may include a first terminal coupled to the input terminal, and a second terminal coupled to the output terminal. The fifth transistor may include a first terminal coupled to the first terminal of the first transistor, a control terminal, and a second terminal coupled to the output terminal.

An embodiment of the present invention provides an amplifier including an input terminal, an output terminal, a first transistor, a second transistor, a fourth transistor, a fifth transistor and a sixth transistor. The input terminal may be used to receive an input signal. The output terminal may be used to transmit an output signal corresponding to the input signal. The first transistor may include a control terminal, a first terminal, and a second terminal. The second transistor may include a first terminal coupled to the second terminal of the first transistor, a control terminal, and a second terminal. The sixth transistor may include a first terminal coupled to a reference voltage source, a control terminal, and a second terminal coupled to the control terminal of the first transistor. The fourth transistor may include a first terminal coupled to the input terminal, and a second terminal coupled to the output terminal. The fifth transistor may include a first terminal coupled to the first terminal of the first transistor, a control terminal, and a second terminal coupled to the output terminal.

DETAILED DESCRIPTION

Figure 1:
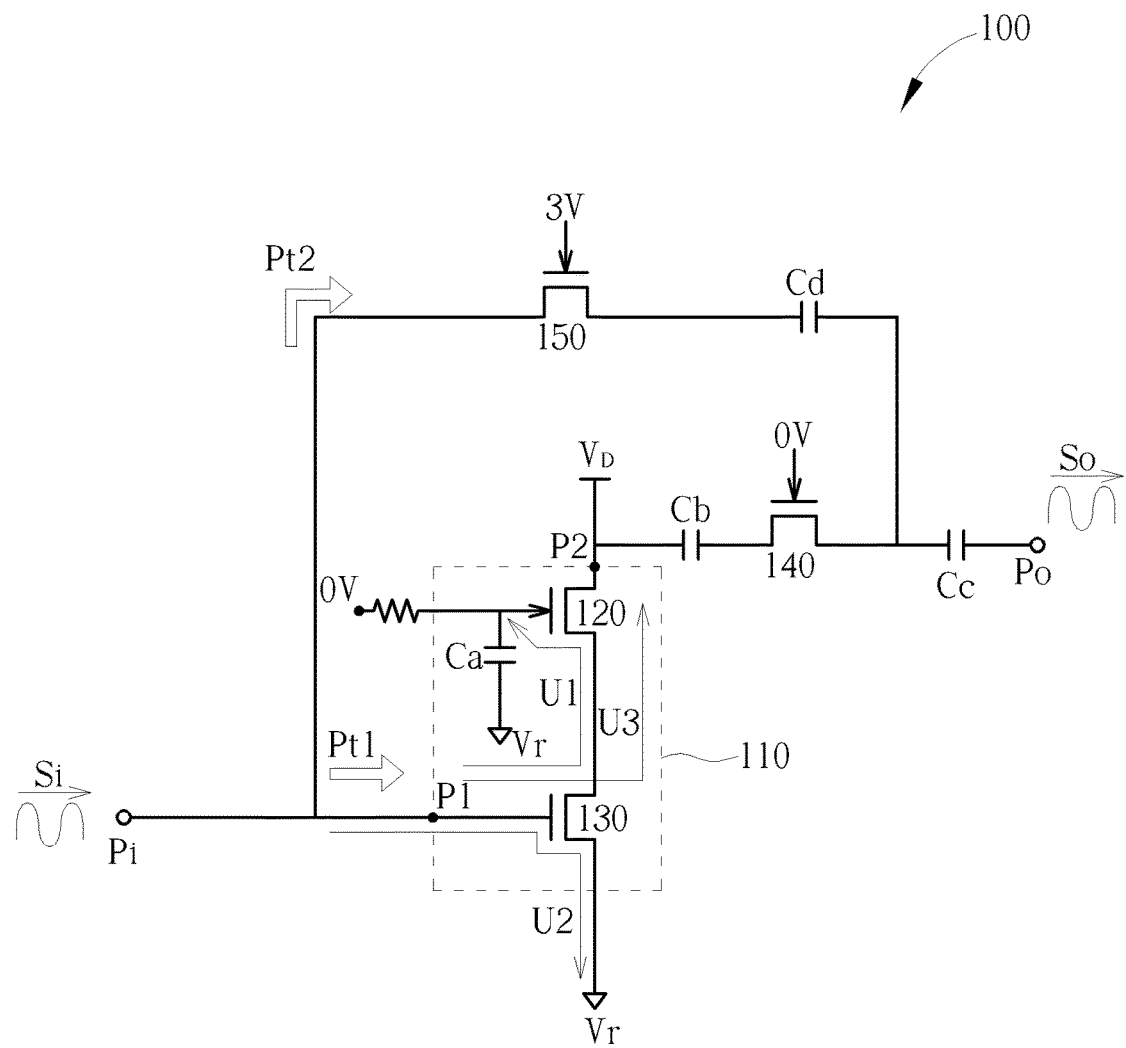
FIG. 1 illustrates an amplifier according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Regarding an amplifier or a partial circuit of an amplifier, when an intensity of an input signal is high, an amplifier may enter a second mode (e.g. a bypass mode) from a first mode (e.g. an amplification mode or a low-noise amplification (LNA) mode) according to an embodiment of the present invention. The intensity of the input signal may be determined to be high when the intensity exceeds a threshold. The threshold may be determined according to users' need and/or product specification. In the figures described below, a terminal may be coupled to a voltage source of 3 volt to describe that the terminal may be coupled to a high voltage source. Another terminal may be coupled to a voltage source of 0 volt to describe that the terminal may be coupled to a low voltage source. The voltage source of 3 volt and the voltage source of 0 volt may merely stand for the high voltage source and the low voltage source respectively, and be used to describe the operation of the present invention instead of limiting the scope or operational voltages of the present invention. A user may adjust operational voltages according to features of components when applying the present invention.

FIG. 1 illustrates an amplifier 100 according to an embodiment of the present invention. The amplifier 100 may include an input terminal Pi used to receive an input signal Si, an output terminal Po used to transmit an output signal So, an amplifier unit 110, a transistor 140 and a transistor 150. The amplifier unit 110 may include a terminal P1 coupled to the input terminal Pi, and a terminal P2. The transistor 140 may be coupled between the terminal P2 and the output terminal Po. The transistor 150 may be coupled between the input terminal Pi and the output terminal Po. The transistor 140 may be coupled to the output terminal Po via a path, and the transistor 150 may be coupled to the output terminal Po via another different path. The amplifier unit 110 may include an amplifier circuit of a cascode structure including transistors 120 and 130. The transistor 120 may act as a common-gate transistor, and the transistor 130 may act as a common-source transistor. Capacitors Ca, Cb, Cc and Cd may be installed in the amplifier 100 optionally. The capacitor Ca may be used to act as an AC (i.e. alternating current) short circuit to allow an AC part of a signal to pass. The capacitors Cb-Cd may block off undesired DC (i.e. direct current) signals. When an intensity of the input signal Si is lower, the amplifier 100 may operate in a first mode (e.g. an amplifying mode) so that the transistor 140 may be turned on, the transistor 150 may be turned off, and the input signal Si may enter the amplifier unit 110 via a path Pt1 to be amplified. When the intensity of the input signal Si is high enough, the amplifier 100 may operate in a second mode (i.e. a bypass mode) so that the transistor 140 may be turned off, the transistor 150 may be turned on, and the input signal Si may flow via a path Pt2 to the output terminal Po to be outputted as the output signal So. The path Pt2 may pass through the transistor 150. For example, if each of the transistors is an N-type metal-oxide-semiconductor field-effect transistor (MOSFET), when the intensity of the input signal Si is high enough, control terminals of the transistors 120 and 140 may be coupled to a ground terminal or a low voltage source so as to turn off the transistors 120 and 140, and a control terminal of the transistor 150 may be coupled to a high voltage source $V_D$ (e.g. a voltage source of 3 volt) so as to turn on the transistor 150. Theoretically, the amplifier unit 110 may enter an inoperative mode when turning off the transistor 120. However, when the intensity of the input signal Si is high enough, unexpected conduction may happen on semiconductor junctions of the transistor 120 and 130 via paths U1, U2 and U3 shown in FIG. 1, and linearity of input signal Si to the output signal So may be affected under the bypass mode.

Figure 2:
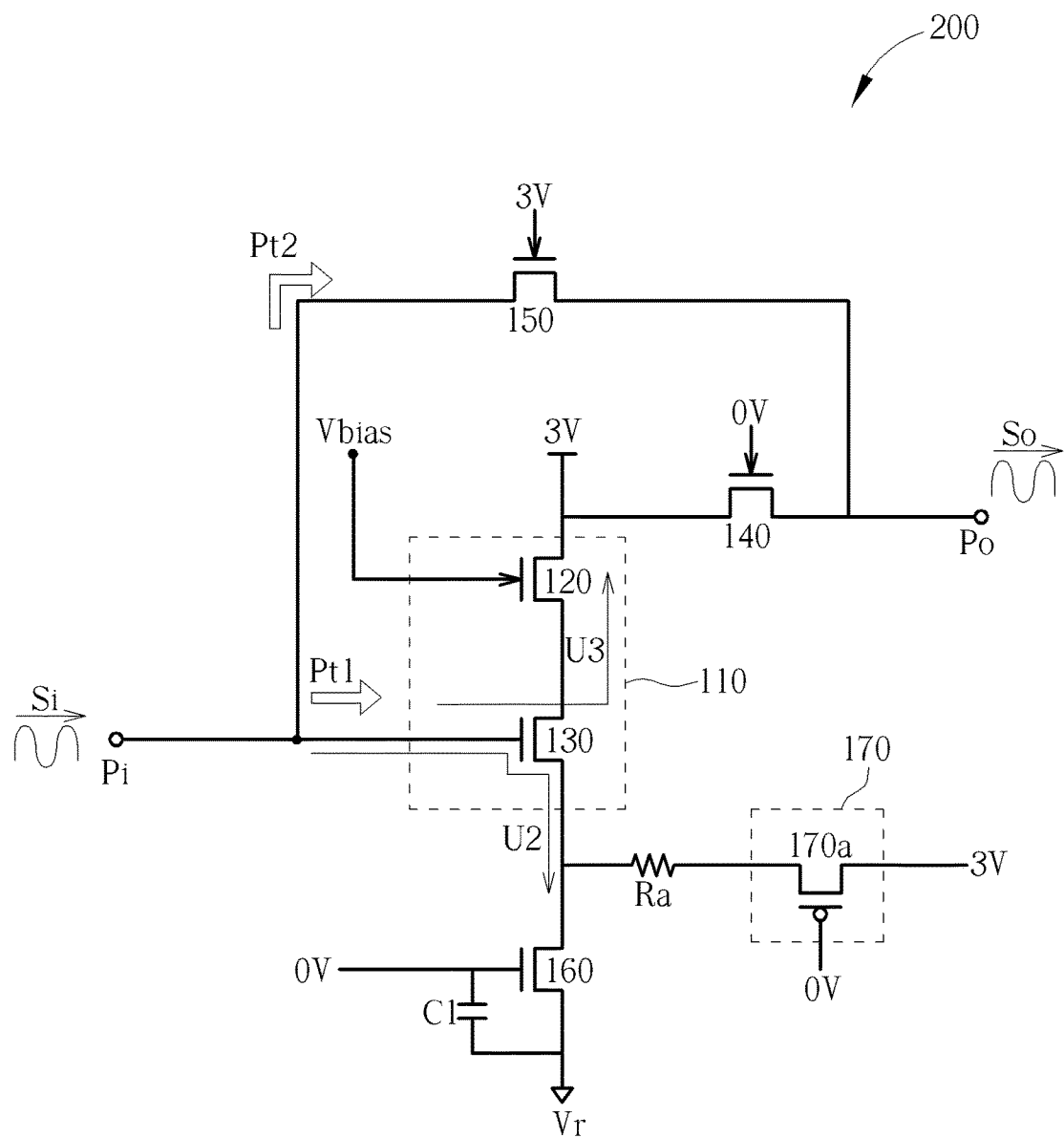
FIG. 2 illustrates an amplifier according to an embodiment of the present invention.
Figure 3:
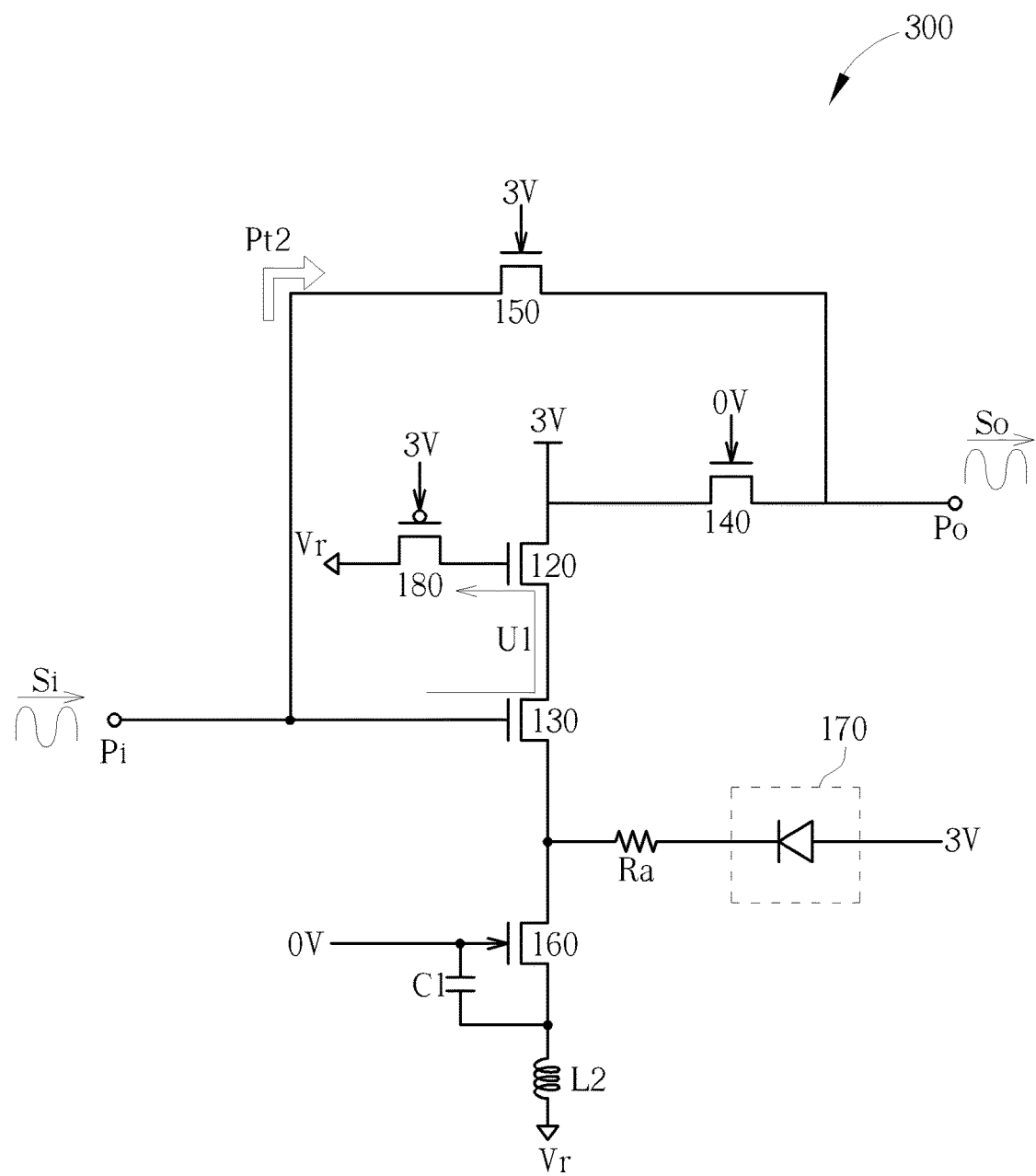
FIG. 3 illustrates an amplifier according to an embodiment of the present invention.

FIG. 2 illustrates an amplifier 200 according to an embodiment of the present invention. The amplifier 200 may include an input terminal Pi, an output terminal Po, transistors 120 to 160, a capacitor C1 and a bias circuit 170. The input terminal Pi may be used to receive an input signal Si. The output terminal Po may be used to transmit an output signal So corresponding to the input signal Si. The transistor 120 may include a control terminal, a first terminal and a second terminal. The control terminal of the transistor 120 may be used to receive a bias voltage Vbias (e.g. 0 volt). The bias voltage Vbias may be provided by a bias circuit. The transistor 130 may include a first terminal coupled to the second terminal of the transistor 120, a control terminal, and a second terminal. The transistor 160 may include a first terminal coupled to the second terminal of the transistor 130, a control terminal, and a second terminal. The capacitor C1 may include a first terminal coupled to the control terminal of the transistor 160, and a second terminal coupled to the second terminal of the transistor 160. The bias circuit 170 may include a first terminal coupled to the first terminal of the transistor 160, and a second terminal. The second terminal of the bias circuit 170 may receive a signal with a high voltage level (e.g. 3 volt) as a bias voltage. The bias circuit 170 may be used to provide a bias voltage to the first terminal of the transistor 160 and the second terminal of the transistor 130. The transistor 150 may provide a bypass path Pt2, and include a first terminal coupled to the input terminal Pi, and a second terminal coupled to the output terminal Po. The transistor 140 may include a first terminal coupled to the first terminal of the transistor 120, a control terminal used to receive a control voltage, and a second terminal coupled to the output terminal Po. The transistors 120 and 130 may form an amplifier unit 110 having a cascode structure. When the intensity of the input signal Si is high enough so that the input signal Si can be received well, the amplifier 200 may enter a bypass mode from an amplifying mode, the transistors 120, 140 and 160 may be turned off substantially, and the bias circuit 170 and the transistor 150 may be turned on substantially. Turning off the transistor 140 may block off the input signal Si from being transmitted to the amplifier unit 110, and the blocked input signal Si may be sent via the transistor 150. Unexpected conduction occurring on semiconductor junctions via the path U3 may hence be avoided. Turning off the transistor 160 may avoid unexpected conduction occurring on semiconductor junctions via the path U2. Turning on the bias circuit 170 may provide the bias voltage (e.g. 3 volt) to the second terminal of the transistor 130 so as to increase reverse-bias between a gate terminal and a source terminal of the transistor 130 so that it may be more difficult to turn on the transistor 130. According to an embodiment of the present invention, the bias circuit 170 may include a transistor 170a, and a control voltage of a low level (e.g. 0 volt) may be inputted to a control terminal of the transistor 170a so as to turn on the transistor 170a. The capacitor C1 coupled between a gate terminal and a source terminal of the transistor 160 may perform AC coupling, so the gate terminal and the source terminal of the transistor 160 may be short with one another in AC domain substantially to turn off the transistor 160. According to an embodiment of the present invention, each of the transistors 120, 130 and 160 may be an N-type MOSFET, the transistor 170a may be a P-type MOSFET, and the second terminal of the bias circuit 170 may receive a signal with a high voltage level (e.g. 3 volt) as the bias voltage provided to the transistor 130. According to an embodiment of the present invention, the bias circuit 170 may include a diode as shown in FIG. 3. The first terminal of the bias circuit 170 may be a cathode of the diode, and the second terminal of the bias circuit 170 may be an anode of the diode. According to an embodiment of the present invention, an impedance unit Ra may be coupled between the first terminal of the bias circuit 170 and the first terminal of the transistor 160 so as to adjust the bias voltage provided by the bias circuit 170.

FIG. 3 illustrates an amplifier 300 according to an embodiment of the present invention. Regarding the amplifier 300, circuit structure being similar to the amplifier 200 is not interpreted repeatedly. Different from FIG. 2, the bias circuit 170 in FIG. 3 may include a diode. The amplifier 300 may further include a transistor 180. The transistor 180 may include a first terminal coupled to a reference voltage source Vr, a control terminal used to receive a control voltage, and a second terminal coupled to the control terminal of the transistor 120. When the intensity of the input signal Si is high enough, the amplifier 300 may enter the bypass mode from the amplifying mode, and the transistors 120 and 180 may be turned off substantially to avoid unwanted conduction occurring across semiconductor junctions via the path U1. According to an embodiment of the present invention, when the transistors 120 and 130 are N-type MOSFETs, the transistor 180 may be a P-type MOSFET. According to an embodiment of the present invention, a match unit L2 may be coupled between the second terminal of the transistor 160 and a reference voltage source Vr for improving return loss (RL) of the amplifier 300. The foresaid reference voltage source Vr may be a ground terminal or a voltage source corresponding to an appropriate voltage level.

Figure 4:
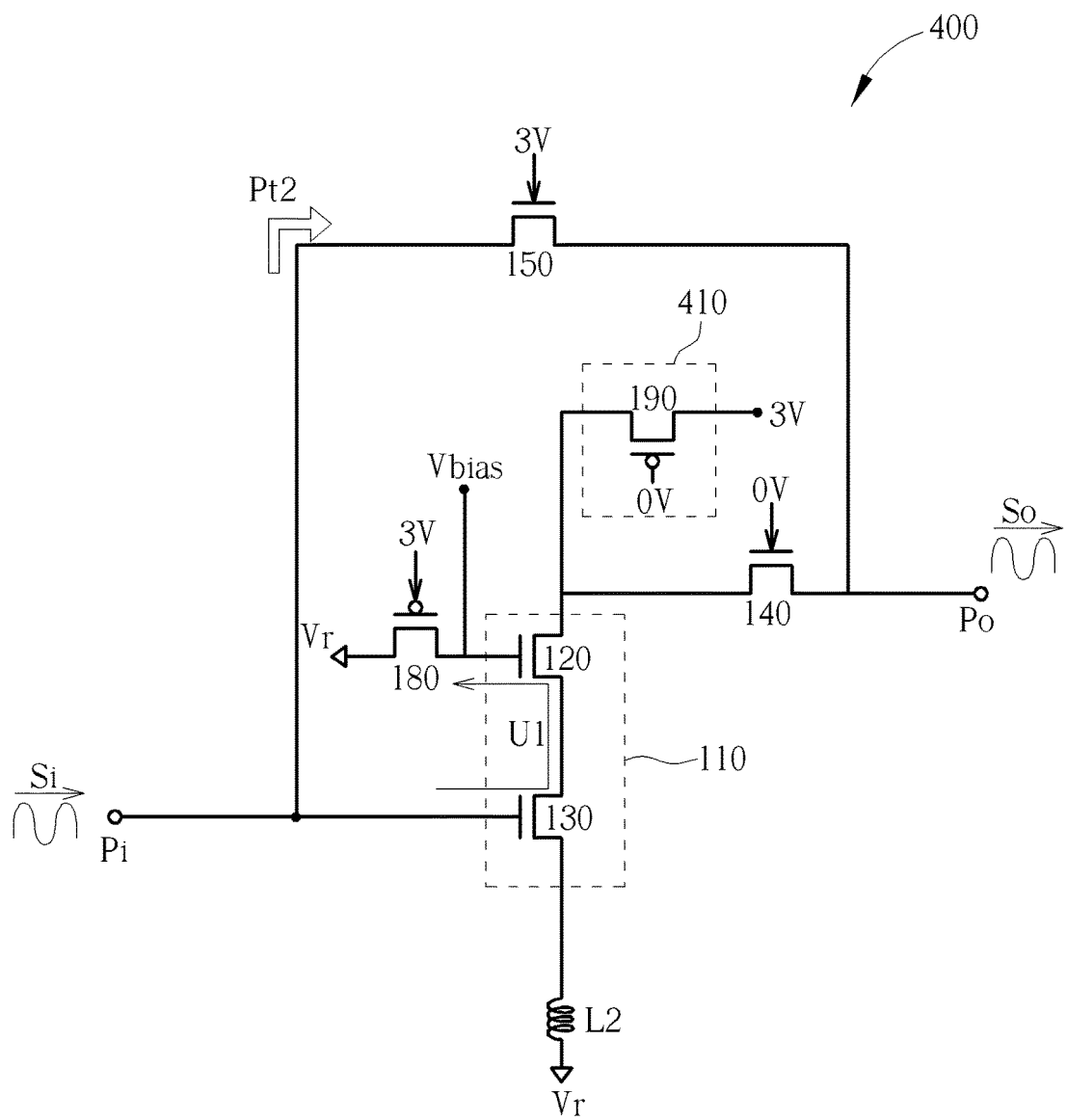
FIG. 4 illustrates an amplifier according to an embodiment of the present invention.

FIG. 4 illustrates an amplifier 400 according to an embodiment of the present invention. The amplifier 400 may have an input terminal Pi to receive an input signal Si, an output terminal Po, and transistors 120, 130, 140, 150 and 180. The transistors 120 and 130 may form the amplifier unit 110 with a cascode structure. The transistor 120 may include the control terminal used to receive the bias voltage Vbias. The bias voltage Vbias may be provided by a bias circuit. When the intensity of the input signal Si is high enough, the amplifier 400 may enter a bypass mode from an amplifying mode so that the transistor 150 may be turned on substantially to provide a bypass path Pt2, the transistor 140 may be turned off substantially to block off the input signal Si from being transmitted to the amplifier unit 110, and the blocked input signal Si may be sent via the transistor 150. The transistor 180 may be turned off substantially to avoid unexpected conduction occurring on semiconductor junctions via the path U1. According to an embodiment of the present invention, the amplifier 400 may further include a bias unit 410 coupled to a first terminal of the transistor 120 and used to provide a bias voltage (e.g. 3 volt) to the first terminal of the transistor 120 for increasing reverse-bias of the transistor 120 so that it may be more difficult to turn on the transistor 120. According to the embodiment of FIG. 4, the transistor 120 may be an N-type MOSFET, and the bias unit 410 may include a transistor 190 that is a P-type MOSFET. The transistor 190 may include a first terminal coupled to the first terminal of the transistor 120, a control terminal used to receive a control voltage, and a second terminal used to receive a signal with a high voltage level (e.g. 3 volt). Under the bypass mode, the transistor 190 of the bias unit 410 may be turned on substantially so that a bias voltage with the high voltage level may be provided to the first terminal of the transistor 120. According to an embodiment of the present invention, the amplifier 400 may further include a match unit L2. The match unit L2 may be coupled between the second terminal of the transistor 130 and the reference voltage source Vr for improving return loss of the amplifier 400.

Figure 5:
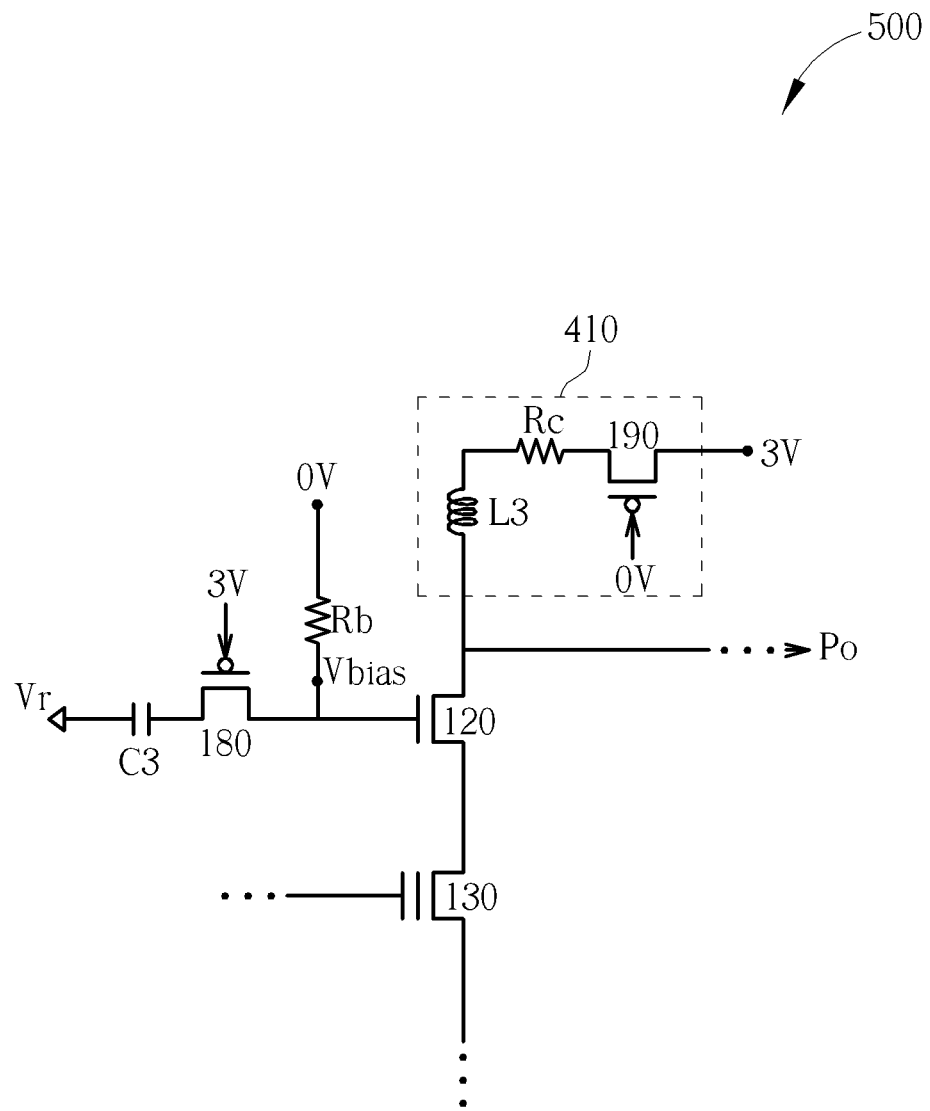
FIG. 5 illustrates a partial circuit of an amplifier according to an embodiment of the present invention.

FIG. 5 illustrates a partial circuit of an amplifier 500 according to an embodiment of the present invention. FIG. 5 illustrates a control circuit controlling the first terminal of the transistor 120, and some exemplified design of the bias unit 410. According to an embodiment of the present invention, the bias unit 410 may further include an impedance unit Rc and/or a match unit L3. In the embodiment shown in FIG. 5, the bias unit 410 includes both of the impedance unit Rc and the match unit L3. The impedance unit Rc may adjust the bias voltage provided by the bias unit 410. The match unit L3 may be coupled between the first terminal of the transistor 190 and the first terminal of the transistor 120. The match unit L3 may be used to match output impedance of the amplifier or improve return loss of the amplifier. An amplifier provided by an embodiment of the present invention may further include a capacitor C3 and/or an impedance unit Rb shown in FIG. 5. The capacitor C3 may be coupled between the reference voltage source Vr and the first terminal of the transistor 180 so as to act as an AC short circuit and block off DC signals. The impedance unit Rb may be coupled to the second terminal of the transistor 180 and used to provide a voltage to the control terminal of the transistor 120 and the second terminal of the transistor 180. Taking FIG. 5 as an example, the impedance unit Rb may be coupled to a voltage source with a low voltage level (e.g. 0 volt) so as to turnoff the transistor 120 and provide the low voltage to the second terminal of the transistor 180. Since the transistor 180 may be a P-type MOSFET, and a control terminal of the transistor 180 may receive a control voltage with a high voltage level (e.g. 3 volt) under a bypass mode, reverse-bias between a gate terminal and a source terminal of the transistor 180 may be increased. It may be more difficult to turn on the transistor 180, and unwanted conduction across junctions may be prevented. According to another embodiment, the bias voltage Vbias may be provided from the impedance unit Rb. In FIGS. 5-9, the dots may mean circuits that are not shown for simplifying the figures.

Figure 6:
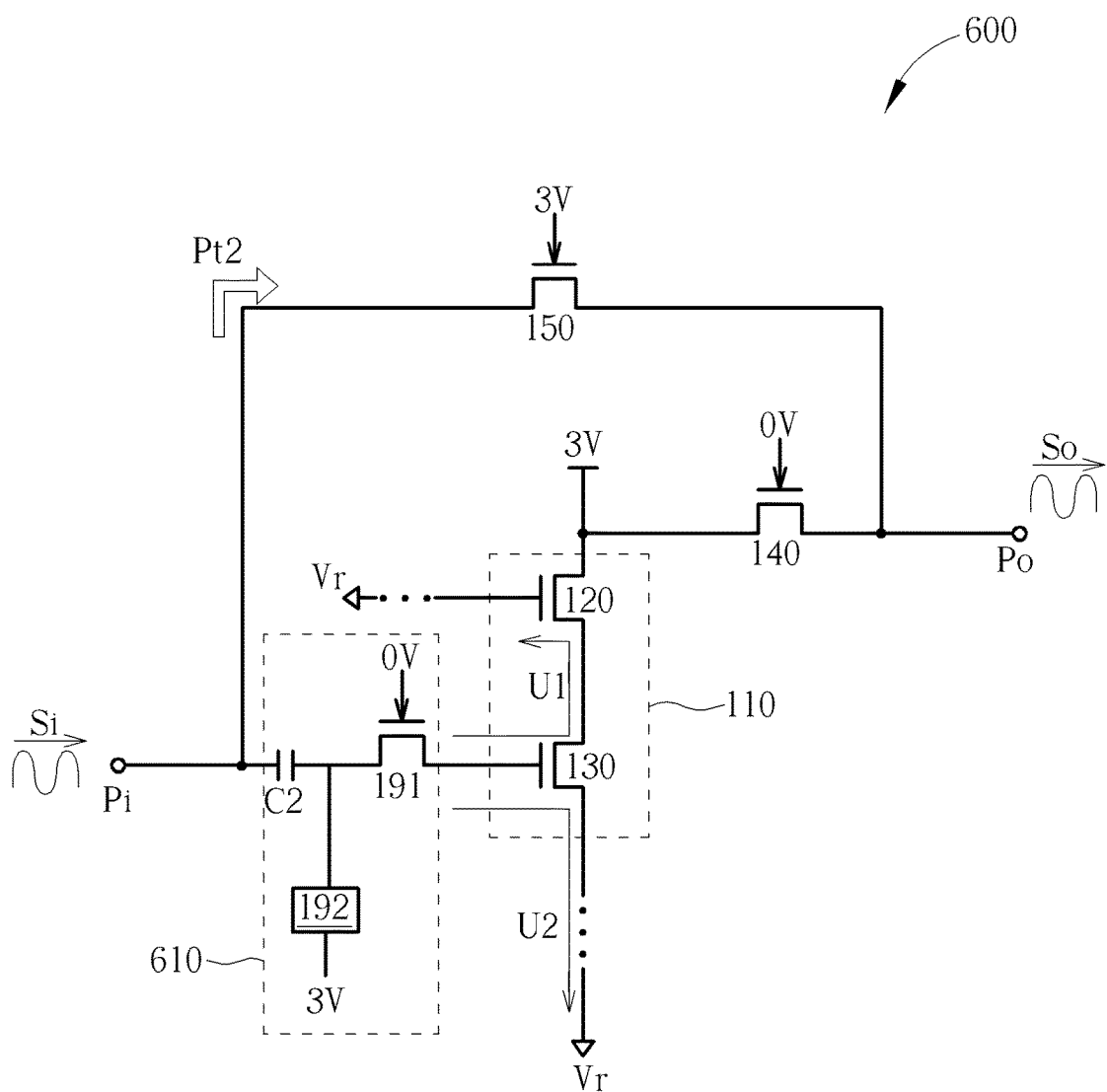
FIG. 6 illustrates an amplifier according to an embodiment of the present invention.

FIG. 6 illustrates an amplifier 600 according to an embodiment of the present invention. The amplifier 600 may include a control unit 610. The control unit 610 may include a transistor 191, a bias unit 192 and a capacitor C2. The transistor 191 may include a first terminal coupled to the control terminal of the transistor 130, a control terminal used to receive a control voltage, and a second terminal coupled to the input terminal Pi. The bias unit 192 may be coupled to the second terminal of the transistor 191 and used to provide a bias voltage (e.g. 3 volt) to the second terminal of the transistor 191. Under a bypass mode, the transistor 191 may be turned off substantially to avoid unexpected conduction on semiconductor junctions via the path U1 and the path U2. The bias unit 192 may be turned on substantially to provide a bias voltage (e.g. 3 volt) to the second terminal of the transistor 191 so as to increase reverse-bias of the transistor 191 and it may be more difficult to turn on the transistor 191. The capacitor C2 may be coupled between the second terminal of the transistor 191 and the input terminal Pi so as to act as an AC short circuit and block off DC signals.

Figure 7:
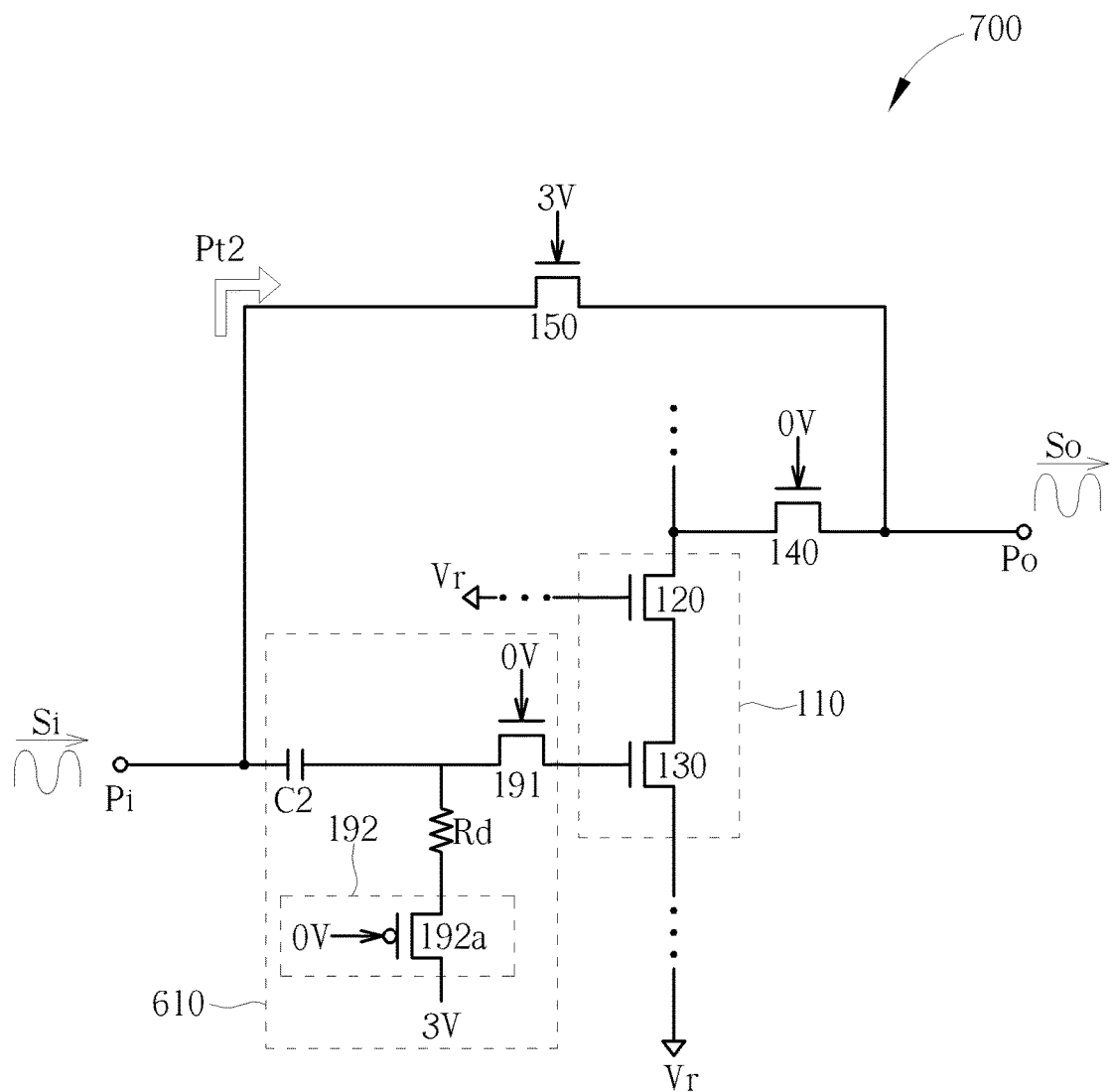
FIG. 7 illustrates an amplifier according to an embodiment of the present invention.

FIG. 7 illustrates an amplifier 700 according to an embodiment of the present invention. In FIG. 7, the bias unit 192 may include a transistor 192a. The transistor 192a may have a first terminal coupled to the second terminal of the transistor 191, a control terminal used to receive a control voltage, and a second terminal used to receive a signal with a high voltage level (e.g. 3 volt). The transistor 191 may be an N-type MOSFET, and the transistor 192a may be a P-type MOSFET. According to an embodiment of the present invention, the control unit 610 may further include an impedance unit Rd. The impedance unit Rd may be coupled between the second terminal of the transistor 191 and the bias unit 192 so as to adjust the bias voltage provided from the bias unit 192.

Figure 8:
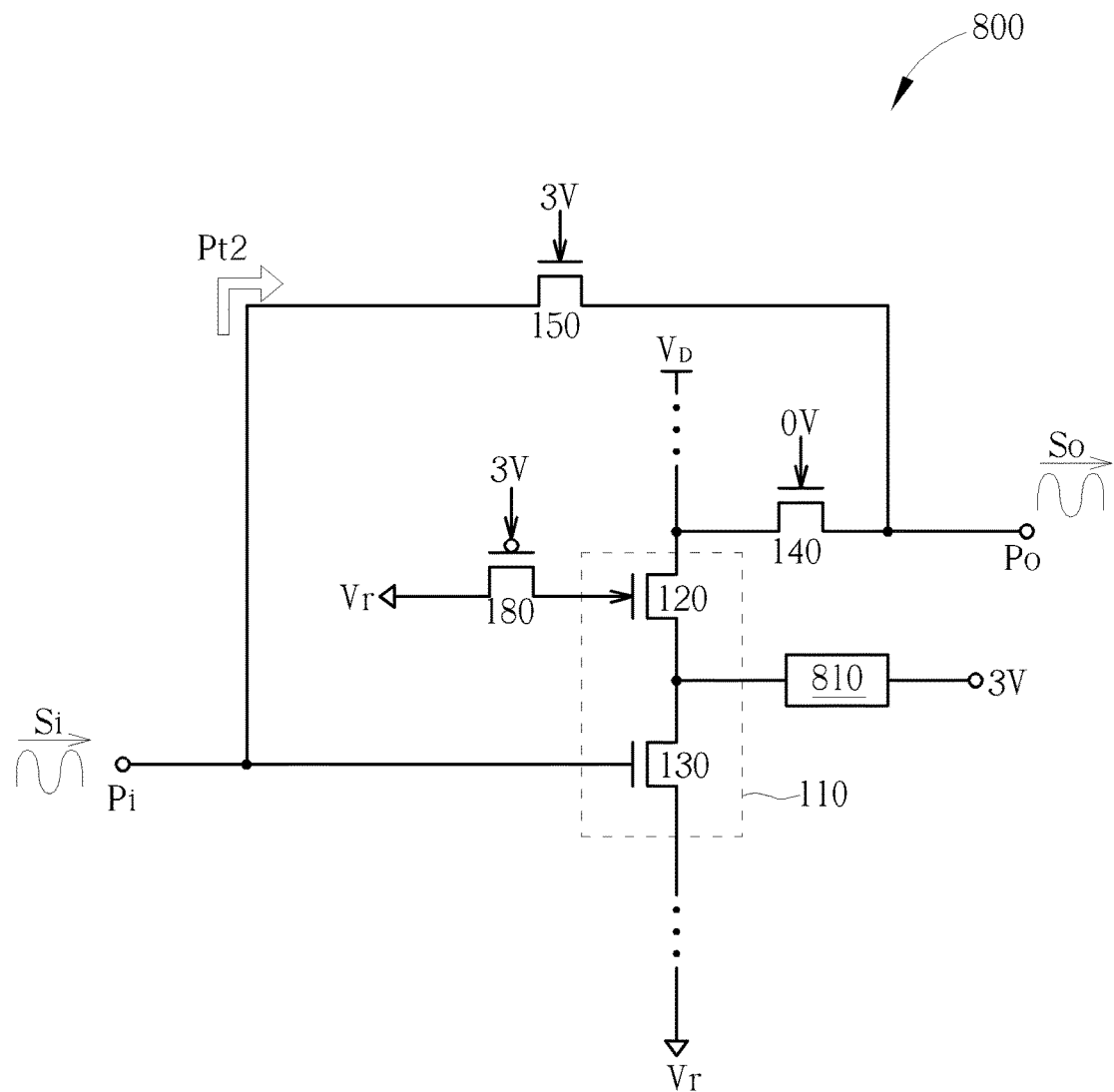
FIG. 8 illustrates an amplifier according to an embodiment of the present invention.
Figure 9:
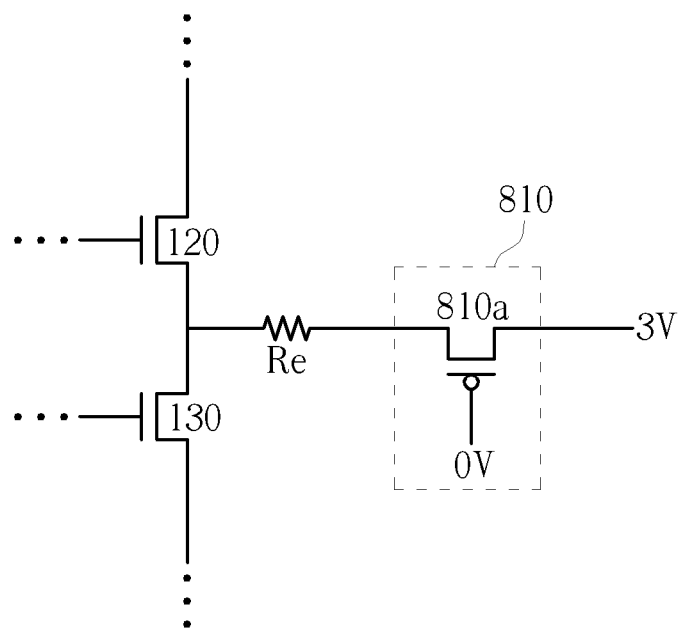
FIG. 9 illustrates a partial circuit of an amplifier according to an embodiment of the present invention.

FIG. 8 illustrates an amplifier 800 according to an embodiment of the present invention. The amplifier 800 may include a bias unit 810 coupled to the second terminal of the transistor 120 so as to provide a bias voltage (e.g. 3 volt) to the second terminal of the transistor 120 and the first terminal of the transistor 130. When the intensity of the input signal Si is high enough so as to make the amplifier 800 enter a bypass mode, the bias unit 810 may be turned on substantially, and the transistors 120 and 130 may be more reversebiased so that it is more difficult to turn on the transistors 120 and 130. FIG. 9 illustrates partial circuit of an amplifier according to an embodiment of the present invention. As shown in FIG. 9, the bias unit 810 may include a transistor 810a. The transistor 810a may include a first terminal coupled to the second terminal of the transistor 120, a control terminal used to receive a control voltage, and a second terminal used to receive a signal with a high voltage level (e.g. 3 volt) for providing a bias voltage. When the transistors 120 and 130 are N-type MOSFETs, the transistor 810a may be a P-type MOSFET. An amplifier provided by an embodiment of the present invention may further include an impedance unit Re coupled between the bias unit 810 and the second terminal of the transistor 120 so as to adjust the bias voltage provided from the bias unit 810.

Figure 10:
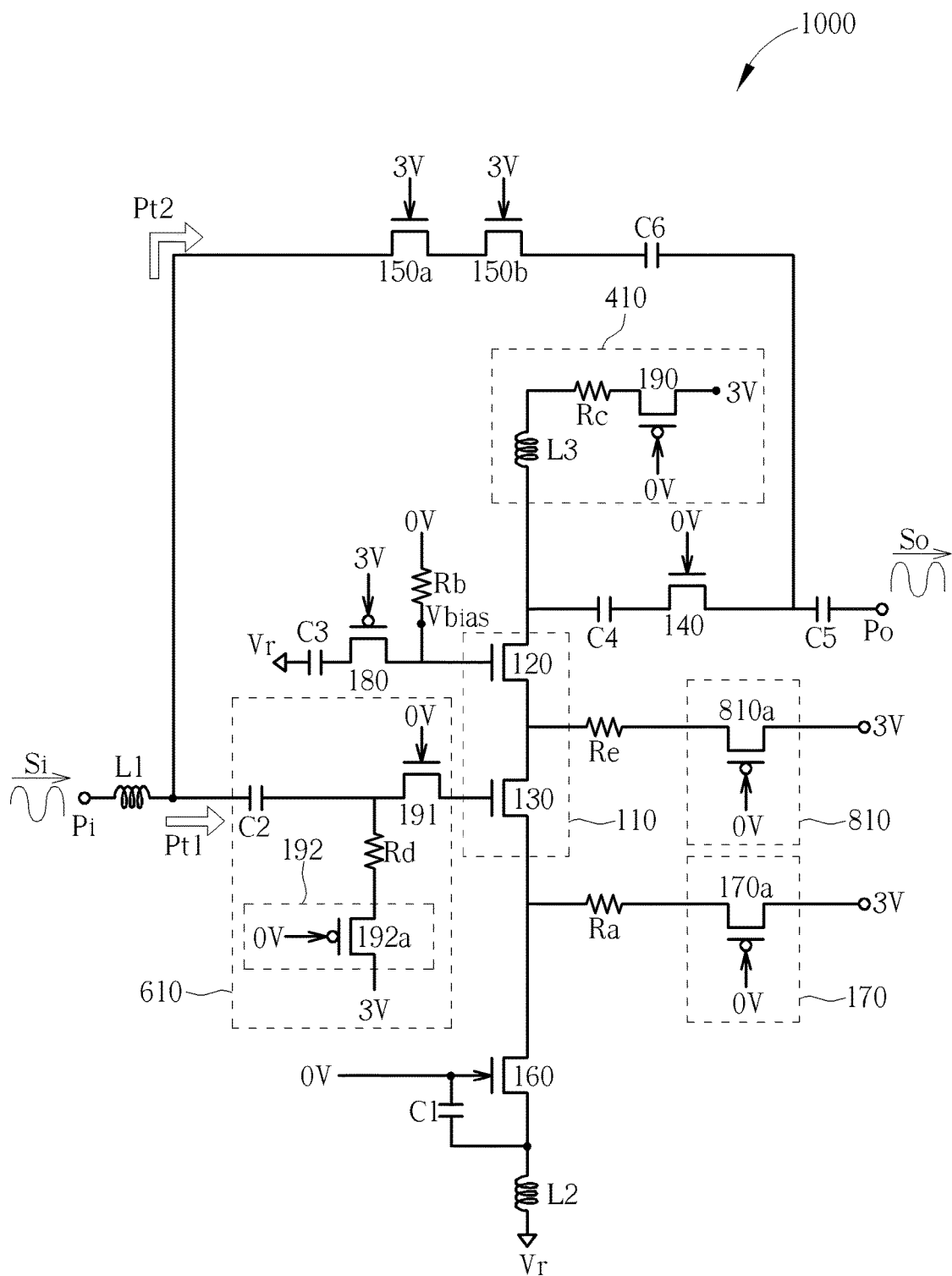
FIG. 10 illustrates an amplifier according to an embodiment of the present invention.

FIG. 10 illustrates an amplifier 1000 according to an embodiment of the present invention. The amplifier 1000 may include the components and units described in FIGS. 1-9 mentioned above, so the related theory of operation is not interpreted repeatedly. The amplifier 1000 may further include other components described below. As shown in FIGS. 1-10, the control terminal of the transistor 130 may be coupled to the input terminal Pi directly or indirectly. As shown in FIG. 10, the amplifier 1000 may further include a match unit L1 and/or a capacitor C5. The match unit L1 may be coupled to the input terminal Pi so as to improve return loss and improve the effect of signal process. The capacitor C5 may be coupled to the output terminal Po. The capacitor C5 may be used to act as an AC short circuit and block off DC signals. As the amplifier 1000 shows, the foresaid transistor 150 of the bypass path Pt2 may be replaced by a plurality of transistors such as transistors 150a and 150b. The amplifier 1000 may further include capacitors C6 and C4. The capacitor C6 may be coupled between the transistor 150b and the output terminal Po. The capacitor C4 may be coupled between the transistors 120 and 140. The capacitors C6 and C4 may be used to act as AC short circuits and block off DC signals.

By using amplifiers provided by embodiments of the present invention, when the intensity of the input signal Si (e.g. a signal received by a wireless communication device) is high enough, unwanted conduction or leakage occurring across semiconductor junctions may be well avoided by turning off related transistors and increasing reverse-bias of transistors. The transistors and components which should be turned non-conductive may be prevented from being turning conductive. In conclusion, the effect of reducing power consumption and operational performance under a bypass mode may be well improved by using amplifiers provided by embodiments of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier comprising:
    an input terminal configured to receive an input signal;
    an output terminal configured to transmit an output signal corresponding to the input signal;
    a first transistor comprising a control terminal, a first terminal, and a second terminal;
    a second transistor comprising a first terminal coupled to the second terminal of the first transistor, a control terminal, and a second terminal;
    a third transistor comprising a first terminal coupled to the second terminal of the second transistor, a control terminal, and a second terminal;
    a bias circuit comprising a first terminal coupled to the first terminal of the third transistor, and a second terminal configured to provide a bias voltage to the first terminal of the third transistor;
    a fourth transistor comprising a first terminal coupled to the input terminal, and a second terminal coupled to the output terminal; and
    a fifth transistor comprising a first terminal coupled to the first terminal of the first transistor, a control terminal, and a second terminal coupled to the output terminal.

2. The amplifier of claim 1, wherein the bias circuit includes a diode, the first terminal of the bias circuit is a cathode of the diode, and the second terminal of the bias circuit is an anode of the diode.

3. The amplifier of claim 1, further comprising a first impedance unit coupled between the first terminal of the bias circuit and the first terminal of the third transistor.

4. The amplifier of claim 1, further comprising:
    a sixth transistor comprising a first terminal coupled to a reference voltage source, a control terminal, and a second terminal coupled to the control terminal of the first transistor.

5. The amplifier of claim 4, further comprising:
    a third bias unit coupled to the second terminal of the first transistor and configured to provide a third bias voltage to the second terminal of the first transistor.

6. The amplifier of claim 4, further comprising a first bias unit coupled to the first terminal of the first transistor and configured to provide a first bias voltage to the first terminal of the first transistor.

7. The amplifier of claim 6, wherein the first bias unit comprising:
    a seventh transistor comprising a first terminal coupled to the first terminal of the first transistor, a control terminal and a second terminal; and
    a second impedance unit and/or a second match unit coupled between the first terminal of the seventh transistor and the first terminal of the first transistor.

8. The amplifier of claim 4, further comprising:
    a first capacitor comprising a first terminal coupled to the reference voltage source and a second terminal coupled to the first terminal of the sixth transistor; and/or
    a third impedance unit coupled to the second terminal of the sixth transistor.

9. The amplifier of claim 1, further comprising a control unit comprising:
    an eighth transistor comprising a first terminal coupled to the control terminal of the second transistor, a control terminal, and a second terminal coupled to the input terminal;
    a second bias unit coupled to the second terminal of the eighth transistor and configured to provide a second bias voltage to the second terminal of the eighth transistor; and
    a second capacitor coupled between the second terminal of the eighth transistor and the input terminal.

10. The amplifier of claim 1, further comprising:
    a third bias unit coupled to the second terminal of the first transistor and configured to provide a third bias voltage to the second terminal of the first transistor.

11. The amplifier of claim 1, wherein the control terminal of the second transistor is coupled to the input terminal.

12. The amplifier of claim 1, wherein the amplifier enters a second mode from a first mode when an intensity of the input signal is greater than a threshold.

13. The amplifier of claim 1, further comprising:
a third capacitor comprising a first terminal coupled to the control terminal of the third transistor, and a second terminal coupled to the second terminal of the third transistor.

* * * * *